(12) United States Patent
Yoshida et al.

(10) Patent No.: US 7,749,620 B2
(45) Date of Patent: Jul. 6, 2010

(54) ELECTROMAGNETIC WAVE SHIELD MATERIAL AND PROCESS FOR PRODUCING THE SAME

(75) Inventors: Taro Yoshida, Tokyo (JP); Atsushi Suzuki, Tokyo (JP); Yasuo Tsubai, Tokyo (JP); Kazuhisa Kobayashi, Tokyo (JP)

(73) Assignees: Fujimori Kogyo Co., Ltd., Tokyo (JP); Mitsubishi Paper Mills Limited, Tokyo (JP)

( * ) Notice: Subject to any disclaimer, the term of this patent is extended or adjusted under 35 U.S.C. 154(b) by 1087 days.

(21) Appl. No.: 10/520,927

(22) PCT Filed: Jul. 11, 2003

(86) PCT No.: PCT/JP03/08842

§ 371 (c)(1),
(2), (4) Date: Aug. 22, 2005

(87) PCT Pub. No.: WO2004/007810

PCT Pub. Date: Jan. 22, 2004

(65) Prior Publication Data

US 2006/0115636 A1    Jun. 1, 2006

(30) Foreign Application Priority Data

Jul. 12, 2002    (JP) ............................... 2002-203638

(51) Int. Cl.
*B32B 5/16* (2006.01)
(52) U.S. Cl. ...................... 428/692; 428/673; 427/128; 430/495.1
(58) Field of Classification Search ................. 428/692, 428/673; 427/128; 430/495.1
See application file for complete search history.

(56) References Cited

U.S. PATENT DOCUMENTS

| | | | |
|---|---|---|---|
| 2,352,014 A | | 6/1944 | Rott |
| 3,822,127 A | | 7/1974 | Tsuboi et al. |
| 4,619,893 A | * | 10/1986 | Takagi et al. ................ 430/519 |
| 5,043,244 A | | 8/1991 | Cairncross et al. |
| 6,706,165 B2 | | 3/2004 | Deng et al. |

FOREIGN PATENT DOCUMENTS

| | | | |
|---|---|---|---|
| JP | 42-23745 B | | 11/1942 |
| JP | 4223745 | * | 11/1942 |
| JP | 42-23745 B | | 11/1967 |
| JP | 49-2621 B | | 1/1974 |
| JP | 4-282639 A | | 10/1992 |
| JP | 5-287542 A | | 11/1993 |
| JP | 7134421 A | | 5/1995 |
| JP | 09-053030 | | 2/1997 |
| JP | 10-151858 A | | 6/1998 |
| JP | 11-126024 | | 5/1999 |
| JP | 11232939 A | | 8/1999 |
| JP | 2000-40896 A | | 2/2000 |
| JP | 2000-261186 A | | 9/2000 |
| JP | 2000-261187 A | | 9/2000 |
| JP | 2000-265087 A | | 9/2000 |
| JP | 2000-294980 | | 10/2000 |
| JP | 2000-329934 | | 11/2000 |
| JP | 2000-357414 | | 12/2000 |
| JP | 2001-038843 | | 2/2001 |
| JP | 2001-047549 | | 2/2001 |
| JP | 2001-051610 | | 2/2001 |
| JP | 2001-057110 | | 2/2001 |
| JP | 2001-060416 | | 3/2001 |

OTHER PUBLICATIONS

English Translation of Japanese Office Action, Pat. Appln. 2004-521193, Apr. 14, 2009.

* cited by examiner

*Primary Examiner*—Leszek Kiliman
(74) *Attorney, Agent, or Firm*—Birch, Stewart, Kolasch & Birch, LLP

(57) ABSTRACT

The present invention is to provide an electromagnetic wave shielding material which comprises a transparent substrate and a fine line pattern formed thereon, wherein the fine line pattern comprises a metal plating film using a physically developed metal silver as a catalytic nucleus and a process for preparing an electromagnetic wave shielding material which comprises exposing a light-sensitive material having a physical development nuclei layer and a silver halide emulsion layer on a transparent substrate in this order, precipitating metal silver with an optional fine line pattern onto the physical development nuclei layer by physical development, then, removing a layer provided on the physical development nuclei layer, and subjecting to plating a metal with the use of the physically developed metal silver as a catalytic nucleus.

19 Claims, No Drawings

ELECTROMAGNETIC WAVE SHIELD MATERIAL AND PROCESS FOR PRODUCING THE SAME

TECHNICAL FIELD

The present invention relates to an electromagnetic wave shielding material which is equipped with a device to which various electronic equipments, communication devices such as a display device, etc., and having both of good light transmittance and a good shielding property of electromagnetic wave, and a process for preparing the same.

BACKGROUND ART

In recent years, accompanying with rapid progress of social information, technologies regarding information-related appliances are also rapidly progressing and spreading. Various electronic equipments, communication devices and display device such as CRT, liquid crystal, EL, PDP and FED have been used for televisions, personal computers, displays for showing information at a station or an airport, and for providing other various kinds of information.

It has been worried about an effect of electromagnetic wave irradiated from these electronic equipments or communication devices. For example, the problem that this electromagnetic wave causes malfunction of neighboring machines or bad influence to human body are considered, so that demands for an electromagnetic wave shielding material becomes higher and higher. To comply with such demands, various transparent conductive films (electromagnetic wave shielding material) have been developed. For example, they are disclosed in Japanese Unexamined Patent Publications No. Hei. 9-53030, No. Hei. 11-126024, No. 2000-294980, No. 2000-357414, No. 2000-329934, No. 2001-38843, No. 2001-47549, No. 2001-51610, No. 2001-57110, No. 2001-60416, and the like.

As a process for preparing these electromagnetic wave shielding materials, it has generally been employed a method in which a conductive metal such as silver, copper, nickel, indium, etc., or a conductive metal compound of these metals is formed on a transparent resin film substrate as a metal thin film by a sputtering method, an ion plating method, an ion beam assist method, a vacuum deposition method, or a wet coating method. However, when a film thickness or pattern fine line width is set with a degree that the transparency can be maintained, a surface resistance of the conductive layer becomes so large to cause as to cause small shielding effect, so that there is a problem that, for example, it is difficult to obtain a shielding effect of 30 dB or higher over higher frequency bands of 300 MHz or higher. Accordingly, an electromagnetic wave shielding material having high transparency and excellent in shielding property over higher frequency band region has been desired. Also, in recent years, demands of the electromagnetic wave shielding material are expanded, and a preparation process that is low cost and has high productivity has been desired.

In Japanese Patent Publication No. Sho. 42-23745, a technique for forming a conductive layer comprising physically developed silver according to a silver complex diffusion transfer development method (DTR development method) by applying a silver halide emulsion layer and a silver halide solvent (silver complex salt-forming materials). However, as mentioned above, to comply with a light transmittance with a total luminous transmittance of 50% or more and a conductivity with a surface resistance of 10 ohm/□ (10 Ω/square) or less are simultaneously satisfied, which are required for an electromagnetic wave shielding material in recent years, it could not be accomplished by the technologies disclosed in the above-mentioned patent publications.

Accordingly, an object of the present invention is to provide an electromagnetic wave shielding material having high conductivity and a high total luminous transmittance even when a fine line pattern with a fine line width which causes a higher aperture rate is provided. Another object of the present invention is to provide a process for preparing an electromagnetic wave shielding material having high conductivity and a high total luminous transmittance with low cost and high productivity.

The above-mentioned objects of the present invention have been basically accomplished by an electromagnetic wave shielding material in which a metal is plated by using physically developed metal silver as a catalytic nucleus.

A basic process for preparing an electromagnetic wave shielding material of the present invention comprises dissolving silver halide with a soluble silver complex salt-forming agent to make a soluble silver complex salt, and simultaneously reducing it with a reducing agent (developing agent) such as hydroquinone, etc., to precipitate physical metal silver with an optional fine line pattern on a physical development nuclei, and subjecting to plating with a metal such as copper, nickel, etc., using the physically developed silver as a catalytic nucleus, which applies a DTR development method known as the photographic development method.

SUMMARY OF THE INVENTION

The electromagnetic wave shielding material of the present invention comprises a transparent substrate and a fine line pattern formed thereon, wherein the fine line pattern comprises a metal plating film using a physically developed metal silver as a catalytic nucleus.

Also, a process for preparing the electromagnetic wave shielding material of the present invention comprises exposing a light-sensitive material having a physical development nuclei layer and a silver halide emulsion layer on a transparent substrate in this order, precipitating metal silver with an optional fine line pattern onto the physical development nuclei layer by physical development, then, removing a layer provided on the physical development nuclei layer, and subjecting to plating a metal with the use of the physically developed metal silver as a catalytic nucleus.

BEST MODE FOR CARRYING OUT THE INVENTION

In the following, the present invention is explained in detail.

As the transparent substrate to be used in the present invention, a plastic resin film which is transparent at visible region, having flexibility, and preferably having good heat resistance may be mentioned. As a transparency, it may be a transparency with a total luminous transmittance of 70 to 90% or so, but in view of maintaining the total luminous transmittance as an electromagnetic wave shielding material to a higher value, higher total luminous transmittance of the transparent substrate is more preferred. Such a transparent substrate may include, for example, a polyester resin such as polyethylene terephthalate, etc., diacetate resin, triacetate resin, acrylic resin, polycarbonate resin, polyvinyl chloride, polyimide resin, polyamide resin, etc., which is a single layer or a complex film with a thickness of 10 to 600 μm.

Onto the transparent substrate, a physical development nuclei layer has been provided previously. As the physical development nuclei, fine particles (a particle size thereof is 1 to several tens nm or so) comprising a heavy metal or a sulfide thereof may be used. For example, there may be mentioned a colloid of gold, silver, etc., or a metal sulfide in which a water-soluble salt of palladium, zinc, etc., and a sulfide are mixed. A fine particle layer of these physical development nuclei can be formed on the transparent substrate by the vacuum deposition method, cathode sputtering method, coating method, etc. In view of production efficiency, the coating method is preferably employed. A content of the physical development nuclei in the physical development nuclei layer is suitably 0.1 to 10 mg or so per 1 $m^2$ with a solid content.

An adhesive layer comprising a polymer latex layer such as vinylidene chloride, polyurethane, etc. may be provided onto the transparent substrate, and an intermediate layer comprising a hydrophilic binder such as gelatin, etc. may be formed between the adhesive layer and the physical development nuclei layer.

The physical development nuclei layer may preferably contain a hydrophilic binder. An amount of the hydrophilic binder is preferably 10 to 300% by weight or so based on the amount of the physical development nuclei. As the hydrophilic binder, gelatin, Gum Arabic, cellulose, albumin, casein, sodium alginate, various kinds of starches, polyvinyl alcohol, polyvinyl pyrrolidone, polyacrylamide, a copolymer of acrylamide and vinyl imidazole, etc., may be used. The physical development nuclei layer may contain a crosslinking agent of the hydrophilic binder.

For coating the physical development nuclei layer or an intermediate layer, etc., it can be carried out by, for example, a coating system such as a dip coating, a slide coating, a curtain coating, a bar coating, an air knife coating, a roll coating, a gravure coating, a spray coating and the like. In the present invention, the physical development nuclei layer is preferably provided by the above-mentioned coating method generally as a continuous and uniform layer.

In the present invention, as a supplying method of the silver halide for precipitating metal silver onto the physical development nuclei layer, there are methods including a method in which a physical development nuclei layer and a silver halide emulsion layer are integrally provided in this order onto a transparent substrate, or a method in which a soluble silver complex salt is supplied from a silver halide emulsion layer provided on another substrate such as paper or a plastic resin film, etc. In view of the cost and production efficiency, it is preferred to use the former method of providing the physical development nuclei layer and the silver halide emulsion layer integrally.

The silver halide emulsion to be used in the present invention can be produced according to the general preparation method of the silver halide emulsion in the field of the light-sensitive silver halide photographic material. The silver halide emulsion can be prepared, in general, by mixing and ripening an aqueous silver nitrate solution and an aqueous halide solution such as sodium chloride and sodium bromide, etc., in the presence of gelatin.

A silver halide composition of the silver halide emulsion layer to be used in the present invention preferably comprises 80 mol % or more of silver chloride, particularly preferably 90 mol % or more of silver chloride. By making the silver chloride content high, conductivity of the formed physically developed silver increases.

The silver halide emulsion layer to be used in the present invention has light-sensitivity to various kinds of light sources. As one of the methods for preparing an electromagnetic wave shielding material, there may be mentioned, for example, a method in which a physically developed silver having a fine line pattern shape such as a lattice-like pattern, etc. is formed. In this case, the silver halide emulsion layer is revealed to a fine line pattern shape, and as the exposing methods, there are a method in which a transparent pattern mask with a fine line pattern and a silver halide emulsion layer are closely contacted and exposed with ultraviolet rays, or a method in which scanning exposure is carried out by using various kinds of laser beams. In the former contact exposure using ultraviolet rays, it can be carried out even when sensitivity of the silver halide is relatively low, but in the case of scanning exposure using laser beam, a relatively high sensitivity is required. Accordingly, when the latter exposure method is employed, to enhance sensitivity of the silver halide, chemical sensitization or spectral sensitization using a sensitizing dye may be applied to the silver halide. As the chemical sensitization, there may be mentioned a metal sensitization using a gold compound or a silver compound, a sulfur sensitization using a sulfur compound, or both sensitizations are used in combination. It is preferably a gold-sulfur sensitization using a gold compound and a sulfur compound in combination. In the method of exposing with the above-mentioned laser beam, by using laser beam having an oscillation wavelength of 450 nm or shorter, for example, using blue color semiconductor laser (which is also called to as violet laser diode) having an oscillation wavelength of 400 to 430 nm, it is possible to handle the material under room light (under light yellow fluorescent light).

In the present invention, a dye or a pigment for preventing from halation or irradiation may be contained in an optional portion of the transparent substrate on which a physical development nuclei layer is to be provided, for example, in an adhesive layer, an intermediate layer, a physical development nuclei layer or a silver halide emulsion layer, or in a back coating layer provided at the back surface of the substrate.

When an electromagnetic wave shielding material is to be prepared by using a light-sensitive material in which a silver halide emulsion layer is provided on a physical development nuclei layer directly or through an intermediate layer, a silver complex diffusion transfer development (the DTR development) (DTR development) occurs by exposing closely contacting a transparent pattern mask with an optional fine line pattern such as a lattice-like pattern with the above-mentioned light-sensitive material, or, subjecting the above-mentioned light-sensitive material to scanning exposure using an output machine which can emit various kinds of laser beams with an optional fine line pattern digital image, and then, treating the resulting material in an alkali solution in the presence of a soluble silver complex salt-forming agent and a reducing agent, whereby silver halide at an unexposed portion is dissolved to become a silver complex salt, and reduced on physical development nuclei to precipitate metal silver, so that a physically developed silver thin film with a fine line pattern can be obtained. The exposed portion becomes black silver by being chemically developed in the silver halide emulsion layer. After the development, the silver halide emulsion layer and the intermediate layer, or the protective layer provided depending on the necessity are removed by washing, whereby a physically developed silver thin film with fine line pattern is revealed at the surface.

The removing method of the silver halide emulsion layer, etc., provided on the physical development nuclei layer after the DTR development may include a method in which they are removed by washing with water, or they are peeled off by transferring them to a peeling paper, etc. Removal by washing with water may include a method in which they are removed by using a scrabbling roller, etc. while spraying hot water as a shower, or a method in which they are removed by jet spraying hot water with a force of water.

On the other hand, when a soluble silver complex salt is fed from a silver halide emulsion layer provided on a different substrate from a transparent substrate on which a physical development nuclei layer has been coated, a physically developed silver thin film with a fine line pattern precipitated on physical development nuclei can be obtained by subjecting a silver halide emulsion layer to exposure in the same manner as mentioned above, the transparent substrate on which the physical development nuclei layer has been coated and the different light-sensitive material on which the silver halide emulsion layer has been coated are closely contacted in an alkali solution in the presence of a soluble silver complex salt-forming agent and a reducing agent, and after taking out the material from the alkali solution, both materials are peeled apart after a lapse of several tens seconds to several minutes.

Next, a soluble silver complex salt-forming agent, a reducing agent, and an alkali solution to be required for the silver complex diffusion transfer development are explained. The soluble silver complex salt-forming agent is a compound which dissolves silver halide to form a soluble silver complex salt, the reducing agent is a compound to reduce the soluble silver complex salt to precipitate metal silver on the physical development nuclei, and these reactions are carried out in an alkali solution.

As the soluble silver complex salt-forming agent to be used in the present invention, there may be mentioned a thiosulfate such as sodium thiosulfate, ammonium thiosulfate, etc., a thiocyanate such as sodium thiocyanate, ammonium thiocyanate, etc., alkanol amine, a sulfite such as sodium sulfite, potassium hydrogen sulfite, etc., compounds described in The Theory of the Photographic Process, edited by T. H. James, 4$^{th}$ Edition, pp. 474 to 475 (1977), and the like.

As the reducing agent to be used in the present invention, developing agents known in the field of photographic development may be used. There may be mentioned, for example, polyhydroxybenzenes such as hydroquinone, catechol, pyrogallol, methylhydroquinone, chlorohydroquinone, etc., 3-pyrazolidones such as 1-phenyl-4,4-dimethyl-3-pyrazolidone, 1-phenyl-3-pyrazolidone, 1-phenyl-4-methyl-4-hydroxymethyl-3-pyrazolidone, etc., p-methyl-aminophenol, p-aminophenol, p-hydroxyphenylglycine, p-phenylenediamine, and the like.

The above-mentioned soluble silver complex salt-forming agent and the reducing agent may be coated with the physical development nuclei layer on the transparent substrate, may be added into the silver halide emulsion layer, or may be added into the alkali solution, and further may be added to a plural number of positions, and it is preferred to add to at least into the alkali solution.

A content of the soluble silver complex salt-forming agent into the alkali solution is suitably used in the range of 0.1 to 5 mol per liter of the developing solution, and a content of the reducing agent is suitably used in the range of 0.05 to 1 mol per liter of the developing solution.

A pH of the alkali solution is preferably 10 or higher, more preferably 11 to 14. As the alkali agent, sodium hydroxide, potassium hydroxide, sodium triphosphate, amino alcohol, etc., may be used. A developing time is preferably 5 to 60 seconds, more preferably 7 to 45 seconds or so. A developing temperature is preferably 10 to 40° C., more preferably 15 to 35° C. or so. In the present invention, a method of applying the alkali solution to carry out the silver complex diffusion transfer development may be a dipping system or a coating system. The dipping system is carried out, for example, by transporting a transparent substrate on which a physical development nuclei layer and a silver halide emulsion layer are provided while dipping it in an alkali solution stored in a tank with a large amount. Also, the coating system is, for example, to coat an alkali solution on a silver halide emulsion layer with an amount of 40 to 120 ml or so per 1 m$^2$.

By the way, as mentioned above, as the fine line pattern, there is a pattern, for example, in which fine lines with a line width of 10 to 100 μm or so are provided in a lattice state to lengthwise and crosswise directions. When line widths are made small and intervals between lines are made large, then light transmittance is improved but conductivity is lowered. To the contrary, when the line widths are made large and intervals between lines are made small, then light transmittance is lowered while conductivity is heightened. When such a fine line pattern is provided on a transparent substrate with a total luminous transmittance of 70 to 90% or so, the physically developed silver with an optional fine line pattern formed on a transparent substrate alone is difficult to satisfy both of the light transmittance of a total luminous transmittance of 50% or higher and the conductivity of a surface resistance of 10 ohm/□ or less simultaneously. The reason is that this physically developed silver has the conductivity of a surface specific resistance of 50 ohm/□ or less, preferably 20 ohm/□ or less, and when it was made a total luminous transmittance of 50% or higher with a fine line width of 40 μm or less, for example, with a pattern of a fine line width of 20 μm, the surface resistance becomes several hundreds ohm/□ to several thousands ohm/□ or higher. However, this physically developed silver itself has conductivity since a firm silver image has been formed. Thus, when such a fine line pattern having a thickness of 15 μm or less and a line width of 40 μm or less is provided on a transparent substrate with a total luminous transmittance of 70 to 90% or so by applying plating using a metal such as copper or nickel, especially applying electrolytic plating, the resulting material has the conductivity of a surface resistance of 10 ohm/□ or less, preferably 7 ohm/□ or less to 0.001 ohm/□ even when the light transmittance thereof is a total luminous transmittance of 50% or higher, preferably 60% or higher.

A thickness of the fine line pattern formed by metal plating can be optionally varied depending on the desired characteristics, and preferably in the range of 0.5 to 15 μm, more preferably in the range of 2 to 12 μm. When the thickness is thinner than the above range, a desired surface resistance value sometimes cannot be obtained, while the thickness is thicker than the above range, there is no significant problem, but a decreasing effect of the surface resistance value cannot be expected whereas efficiency of plating work is lowered. Also, the electromagnetic wave shielding material of the present invention can provide a shielding effect of 30 dB or more over the higher frequency band of 30 MHz to 1,000 MHz or more.

In the present invention, plating of the physically developed silver of the fine line pattern can be carried out by either of the electroless plating method, the electrolytic plating method or the plating method in which both of the above are combined. For producing the electromagnetic wave shielding material of the present invention, it is preferred to use the method of electrolytic plating or electroless plating is used in combination thereto, in the viewpoint that a role of the treatments of at least exposure of the fine line pattern, developing treatment and plating treatment can be applied continuously with a roll state as such to a continuous web in a roll state in which a physical development nuclei layer and a silver halide emulsion layer have been formed on a transparent substrate and in view of working efficiency of plating. The plating layer of the physical development silver of the fine line pattern has a high electric conductivity, so that electrolytic plating can be carried out easily.

In the present invention, the metal plating method can be carried out by the conventionally known method. For example, the electrolytic plating method can be carried out by using a metal such as copper, nickel, silver, gold, solder, or copper/nickel, etc., and the conventionally known method in which a multi-layer or a composite type electrolytic plating film(s) thereof are formed can be used. With regard to these techniques, literatures such as "Surface Treatment Technique Comprehensive; K. K. Gijutsu Shiryo Center, Dec. 21, 1987 Initial Edition, pp. 281 to 422", and the like can be referred to.

It is preferred to use copper and/or nickel since plating is easy, conductivity is excellent, plating can be carried out with a thick film, and cost is low. Examples of the electrolytic plating may include a method in which the above-mentioned transparent substrate on which the physically developed silver has been formed is dipped in a bath comprising copper sulfate and sulfuric acid, etc., as main components and passing electricity with a current density of 1 to 20 ampere/dm$^2$ at 10 to 40° C.

In the electromagnetic wave shielding material of the present invention, when the fine line pattern has a thickness of 0.5 to 15 μm and a line width of 1 to 40 μm, it can show excellent light-transmitting property and conductive property of a total luminous transmittance of 50% or higher, and a surface resistance of 10 ohm/□ or less, and show a shielding effect of 30 dB or more over higher frequency region of 30 MHz to 1,000 MHz or more. And the shielding effects can be expected sufficiently over higher frequency bands of several tens GHz bands.

The electromagnetic wave shielding material of the present invention may have an optional layer at the side having the electromagnetic wave shielding layer or at the opposite side of the substrate, for example, a protective layer, a near infrared absorption layer, etc., and these layers may be provided by coating or adhering a film.

Also, for the purpose of making it easier to see a scene through the fine line pattern(s), it is preferred to subject the surface of the plating layer to a blackening treatment by using an acid or an alkali, or by plating.

EXAMPLE

In the following, the present invention is explained in more detail by referring to Examples.

Example 1

A polyethylene terephthalate film having a thickness of 100 μm and a total luminous transmittance of 89% was used as a transparent substrate. This film substrate has a subbing layer comprising a vinylidene chloride and a gelatin layer with 50 mg/m$^2$. On the above film, a hydrosol solution containing 0.4 mg/m$^2$ of palladium sulfate in terms of a solid content was coated and dried to form a physical development nuclei layer.

Subsequently, a silver halide emulsion layer (prepared so that it becomes 90 mol % of silver chloride and 10 mol % of silver bromide, and an average particle size of 0.23 μm) prepared by a general double-jet mixing method of a silver halide emulsion for photography was coated on the above-mentioned physical development nuclei layer. It was coated so that a weight ratio of silver (silver nitrate)/gelatin in the silver halide emulsion layer became 1.5 and a silver halide amount (calculated on silver nitrate) of 4 g/m$^2$ to prepare a light-sensitive material.

This light-sensitive material was exposed through a transparent pattern mask with a fine line pattern using a daylight film vacuum contact printer which employs a mercury lamp as a light source, subsequently developed by dipping in a commercially available developer for a silver complex salt diffusion transfer at 25° C. for 40 seconds, and then, washed away the silver halide emulsion layer to form a physically developed silver thin film with a fine line pattern which has a fine line width of 20 μm, a thickness of the fine line of 0.05 to 0.1 μm and a fine line interval of 200 μm.

The total luminous transmittance of the electromagnetic wave shielding material (Comparative sample 1) in which a fine line pattern state silver thin film had been formed obtained as mentioned above was 76%. The surface resistance value of the Comparative sample 1 was measured according to the measurement method of JIS K 7194. As a result, the surface resistance value was 850 ohm/□. Also, Comparative sample 1 showed a shielding property of 27 dB at 500 MHz and of 23 dB at 1,000 MHz. For the reference purpose, the above-mentioned light-sensitive material was developed without exposure in the same manner as in Comparative sample 1 and a physically developed silver thin film was formed on the whole surface. The surface specific resistance of this sample was 13 ohm/□.

Next, the above-mentioned Comparative sample 1 was subjected to electrolytic plating treatment as mentioned below. Using a processing solution for an electrolytic copper plating (copper sulfate: 75 g/l, sulfuric acid: 190 g/l, chloride ion: 50 ppm), and according to the predetermined method (25° C., 3 A/cm$^2$), copper plating was applied on the physically developed silver film with a thickness of 5 μm to prepare Sample A of the present invention. As a result of the measurements of the total luminous transmittance and the surface resistance value in the same manner as in Comparative sample 1, Sample A of the present invention had the total luminous transmittance of 73% and the surface resistance value of 0.5 ohm/□, and it showed a shielding property of 56 dB at 500 MHz and of 63 dB at 1,000 MHz.

Example 2

In the same manner as in Example 1 except that a plating solution comprising copper and a plating solution comprising nickel were used, and an electrolytic plating of copper and nickel with a total film thickness of 5 μm was applied, Sample B of the present invention was prepared. As results of the measurements of the total luminous transmittance and the surface resistance value, Sample B of the present invention had the total luminous transmittance of 71% and the surface resistance value of 0.3 ohm/□, and it showed a shielding property of 60 dB at 500 MHz, and of 64 dB at 1,000 MHz.

INDUSTRIAL APPLICABILITY

According to the present invention, an electromagnetic wave shielding material having excellent light transmittance and shielding property over wide frequency bands can be obtained.

The invention claimed is:

1. An electromagnetic wave shielding material which comprises a transparent substrate, physically developed nuclei laid thereon, a layer of physically developed silver having a fine line pattern formed on said nuclei, and a metal film plated on said physically developed silver, wherein the fine line pattern has a line width of 40 μm or less, a total luminous transmittance of 50% or higher, and a surface resistance of 10 ohm/□ or less.

2. The electromagnetic wave shielding material according to claim 1, wherein the fine line pattern has a thickness of 15 μm.

3. The electromagnetic wave shielding material according to claim 2, wherein the total luminous transmittance is 60% or higher.

4. The electromagnetic wave shielding material according to claim 2, wherein the surface resistance is 7 ohm/☐ or less.

5. The electromagnetic wave shielding material according claim 2, wherein the thickness of the fine line pattern is 0.5 to 15 μm.

6. The electromagnetic wave shielding material according to claim 5, wherein the thickness of the fine line pattern is 2 to 12 μm.

7. The electromagnetic wave shielding material according to claim 2, wherein the line width of the fine line pattern is 1 to 40 μm.

8. The electromagnetic wave shielding material according to claim 1, wherein the plating is an electrolytic plating.

9. The electromagnetic wave shielding material according to claim 1, wherein the plating is at least one kind of plating selected from copper and nickel.

10. A process for preparing an electromagnetic wave shielding material which comprises exposing a light-sensitive material having a physical development nuclei layer and a silver halide emulsion layer on a transparent substrate in this order, precipitating metal silver with a pattern having an optional fine line onto the physical development nuclei layer by physical development, then,
    removing a layer provided on the physical development nuclei layer, and
    subjecting to plating a metal with the use of the physically developed metal silver as a catalytic nucleus to obtain an electromagnetic wave shielding material having a fine line pattern.

11. The process for preparing an electromagnetic wave shielding material according to claim 10, wherein the fine line pattern after the metal plating has a thickness of 15 μm or less and a line width of 40 μm or less, a total luminous transmittance of 50% or higher, and a surface resistance of 10 ohm/☐ or less.

12. The process for preparing an electromagnetic wave shielding material according to claim 11, wherein the total luminous transmittance is 60% or higher.

13. The process for preparing an electromagnetic wave shielding material according to claim 11, wherein the surface resistance is 7 ohm/☐ or less.

14. The process for preparing an electromagnetic wave shielding material according to claim 11, wherein after the metal plating the thickness of the fine line pattern is 0.5 to 15 μm.

15. The process for preparing an electromagnetic wave shielding material according to claim 14, wherein after the metal plating the thickness of the fine line pattern is 2 to 12 μm.

16. The process for preparing an electromagnetic wave shielding material according to claim 11, wherein after the metal plating the line width of the fine line pattern is 1 to 40 μm.

17. The process for preparing an electromagnetic wave shielding material according to claim 10, wherein the plating is an electrolytic plating.

18. The process for preparing an electromagnetic wave shielding material according to claim 10, wherein the plating is at least one kind of plating selected from copper and nickel.

19. The process for preparing an electromagnetic wave shielding material according to claim 18, wherein an electrolytic plating is carried out by dipping a transparent substrate on which a physically developed silver has been formed in a bath containing copper sulfate and sulfuric acid as main components with a current density of 1 to 20 ampere/dm$^2$ at 10 to 40° C.

* * * * *